United States Patent [19]

Bumgardner

[11] 3,999,083
[45] Dec. 21, 1976

[54] AUTOMATIC THRESHOLD CIRCUIT

[75] Inventor: Jon H. Bumgardner, Ridgecrest, Calif.

[73] Assignee: The United States of America as represented by the Secretary of the Navy, Washington, D.C.

[22] Filed: Mar. 31, 1975

[21] Appl. No.: 563,936

[52] U.S. Cl. .................. 307/235 J; 307/235 K; 307/237; 328/147

[51] Int. Cl.$^2$ ............ H03K 5/20; H03B 3/02

[58] Field of Search ......... 307/235 J, 235 K, 268, 307/237; 328/147, 162, 165, 167

[56] References Cited
UNITED STATES PATENTS

| | | | |
|---|---|---|---|
| 3,548,206 | 12/1970 | Ogle et al. | 328/147 X |
| 3,576,451 | 4/1971 | Markow | 307/235 J |
| 3,737,790 | 6/1973 | Brown | 307/235 J |
| 3,743,950 | 7/1973 | Sellari, Jr. et al. | 307/235 K |

Primary Examiner—John Zazworsky
Attorney, Agent, or Firm—R. S. Sciascia; Roy Miller

[57] ABSTRACT

An automatic threshold circuit to establish a threshold that is a specified number of *db* above the input's rms frequency weighted noise value wherein the input is compared with the feedback threshold value, the result of which is coupled to a limiter for providing an output of +1, or −1 volt, depending on the input's relationship to the reference. The output of the limiter is combined with a preselected value and integrated. The integrated output is coupled through a clamping circuit that limits its output to positive values, which values are the feedback voltage coupled to the comparator.

4 Claims, 2 Drawing Figures

AUTOMATIC THRESHOLD CIRCUIT

BACKGROUND OF THE INVENTION

In the field of electronic signal processing many problems exist in measuring the amplitude of Gaussian noise. If a threshold voltage a certain number of db above the rms value of Gaussian noise is employed, linearity is normally very difficult to achieve for low level inputs. This is especially true if the system is designed to operate over a very wide range of noise input voltages. Of the types of systems previously employed the normal peak storage circuits become very non-linear when the input voltage is below the normal breakdown voltage, i.e., forward bias voltage, of currently available diodes. This means that for any input below approximately 200 millivolts the input noise cannot be accurately measured by rectification, especially where very wide band measurement is required. Such requirement exists in laser or short pulse laser receivers.

The present invention approaches Gaussian noise amplitude measurement in a different manner. Instead of trying to measure the high values of noise voltage of the randomly changing noise signal, a servo circuit is employed wherein the input signal which includes noise is supplied to one terminal of a comparator. The output of the comparator is supplied to a limiter, causing the limiter's output voltage level to be +1 when the system input signal is greater than a variable threshold level coupled to the other terminal of the comparator, and to be −1 when it is less than the variable threshold level. If the limiter's output were filtered and the variable threshold were always equal to or greater than zero the voltage value of the limiter's output would correspond to the percentage of time that the system input were greater than the threshold level. A minimum of −1 volt output corresponds to the situation wherein the absolute value of the system input is never greater than the threshold level, and zero volts output corresponds to the situation where the absolute value of the system input is greater than the threshold level 100% of the time. Absolute value may be used since Gaussian noise can be validly considered as being ± voltage-time symetrical about zero volts.

DESCRIPTION OF THE PREFERRED EMBODIMENT

Figure 1:
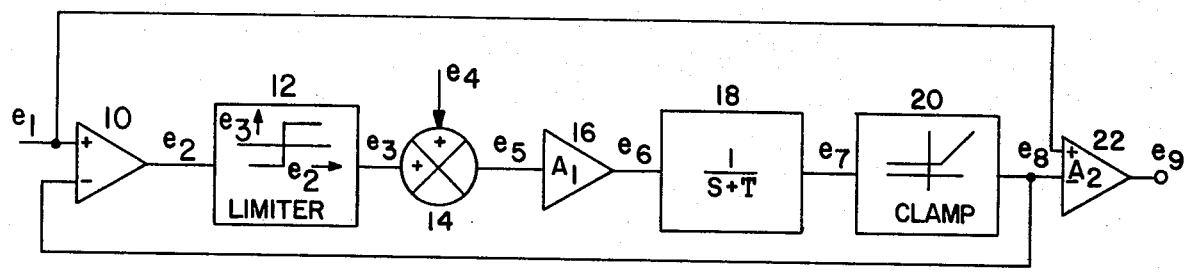
FIG. 1 is a block diagram of the technique of the present invention.

FIG. 1 shows the technique for the Gaussian noise amplitude measurement employed by the present invention. A system input $e_1$, such as a video signal including noise, is coupled to one terminal of comparator 10. The other input to the comparator is a system controlled variable threshold level. Output $e_2$ of comparator 10 is coupled through a limiter which provides an output $e_3$ of "+1" when the system input is greater than the system threshold level, and "−1" when the system input is less than the system threshold level, for example. Output $e_3$ is then filtered to obtain an average value of $e_3$, which average value corresponds to the percentage of time that the system input is greater than the threshold level. A minimum of "−1" volt out corresponds to the situation wherein the absolute value of the system input never exceeds the threshold level, and "0" volts out corresponds to the situation wherein the absolute value of the system input exceeds the threshold level 100% of the time.

With the present invention, the system's variable threshold is adjusted to a level such that the system input $e_1$ is above that threshold a certain percentage of the time, for example 15.9% of the time. This setting corresponds to a value of $e_8$ equal to the rms value of system input $e_1$, or the $1\sigma$ point, i.e., one standard deviation, according to conventional statistical analysis. For that condition to exist limiter output $e_3$ must be set at 15.9% down from zero volts, based on a 1 volt interval or, in other words, −159mv.

If additional input $e_4$ coupled to summer 14 is set at +159mv, output $e_5$ of summer 14 will be very close to zero volts. If output $e_5$ deviates far from zero volts a large negative feedback voltage $e_8$ will be developed which will drive $e_5$ back to an arbitrarily small value, much in the same way as do all feedback corrective systems. Clamp 20 limits threshold level $e_8$ to some small error zone above zero. It is employed to insure that the hysteresis of comparator 10 will not cause the servo circuit to go into a continual search mode when the system input signals are smaller then the hysteresis value of the comparator. Amplifier 22 is set at gain $A_2$ sufficiently high to provide the threshold the required number of db above the rms noise voltage level and compare input $e_1$ with the threshold provided. Thus, once the false alarm value is determined for the threshold detecting circuit one can calculate gain $A_2$ as the number of standard deviations $N\sigma$ necessary from a normal distribution curve, or from the following equation:

$$A_2 = 20 \log_{10} (N\sigma)$$

If it is desirable to know the deviation from the true rms value of system input $e_1$ that threshold level $e_8$ would have with a sharply peaked frequency band, we being first by assuming a pure sine wave input to the system. The servo would drive threshold level $e_8$ to a value that would cause system input $e_1$ to be greater than the threshold level 15.9% of the time. The threshold level divided by the peak system input is $$\frac{e_8}{e_{1_{peak}}} = \cos \left[ \frac{-159}{2} \times 360 \right] = .88$$

which for a pure sine wave should be 0.707. Thus, the servo for the above specified value of input $e_4$ is an indicated value 25% above the true rms value, which 25% is the maximum error for noise signals containing predominantly one frequency, i.e., a sharply peaked frequency band.

If it were desirable to have zero error output for both Gaussian white noise and signal sine waves, it could be accomplished by adjusting input $e_4$ to some value other than that of the rms value of the Gaussian noise, and then compensating the threshold level by changing gain $A_2$ of amplifier 22. The following is the procedure that should be followed to arrive at the value of input $e_4$. First assume both sine and white noise signal sources of one volt rms each and ask the question, what threshold level $e_8$ will produce identical duty cycle outputs of limiter output $e_3$ for both? Then, write an expression for the duty cycle as a function of threshold level $e_8$ for each of the two inputs. To do so first solve for $\rho_1$, which is the percent of time that the output of comparator 10 is low for a sine wave input, $$\rho_1 = \frac{t - \phi}{\tau}.$$

For the 1 volt rms assumed, $$\rho_1 = \frac{360° - 2 \left[ \cos^{-1}\left(\frac{V_t}{\sqrt{2}}\right) \right]°}{360°}$$

Then, for Gaussian distribution $$\rho_2 = \int_{-\infty}^{V_t} \frac{1}{\sqrt{2\pi}} e^{-x^2/2} dx$$

since $f(x)$ for a Gaussian source is $$f(x) = \frac{1}{\sigma \sqrt{2\pi}} e^{-(x-\eta)^2/2\sigma^2}.$$

and $\eta$ has been caused to be zero and $\nu$ is set equal to 1. Then $$\rho_2 = \frac{1}{2} + \int_0^{V_t} \frac{1}{\sqrt{2\pi}} e^{-x^2/2} dx.$$

Since $\rho_1$ will always be forced to equal $\rho_2$, then $$\rho_1 = 1 - \frac{2 \cos^{-1}\left(\frac{V_t}{\sqrt{2}}\right)}{360} = \frac{1}{2} + \int_0^{V_t} \frac{1}{\sqrt{2\pi}} e^{-x^2/2} dx, \quad V_t > 0$$

By analysis $V_t$ was found to be close to 1.36. For $V_t = 1.36$, error = 0.0015; for $V_t = 1.37$, error = −.0055. By setting the servo to give $V_t = 1.362 \times$ rms value of system input $e_1$ the error between sine and Gaussian inputs is less than 0.1 percent. And, $\rho$, comparator 10 "off" time, is 91% which corresponds to a value of input $e_4$ of + 86mv. Gain $A_2$ of amplifier 22 is then $$A'_2 = 20 \log_{10}\left(\frac{N_\sigma}{1.36}\right).$$

New gain $A'_2$ will permit accurate rms measurement of any combination of randomly phased sine waves or Gaussian noise coupled to the system input.

The present invention has the advantages over prior techniques and apparatus of being simple, accurate, and can be tailor made to any time response criteria such as receiver automatic gain control settings. It also adjusts to any video frequency response characteristics. The threshold level created is insensitive to the noise spectrum received and signal amplitude distribution.

Figure 2:
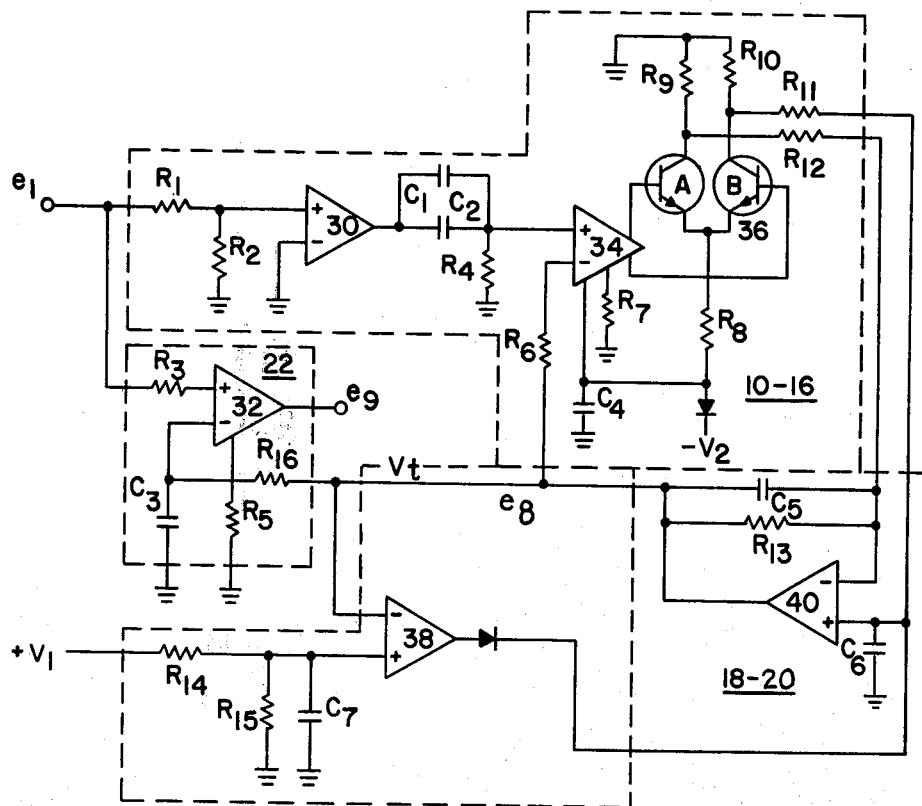
FIG. 2 is a schematic diagram of a specific embodiment of the present invention.

FIG. 2 shows a specific embodiment of the present invention. The blocks of FIG. 2 having numbers consistent with the blocks of FIG. 1 perform the respective function as described in the description of FIG. 1. Being a specific embodiment of the present invention the arrangement of the components in FIG. 2 is to provide an operable circuit that will achieve the purposes of the present invention.

Input signals $e_1$ including noise is coupled to amplifier 10 which includes high gain video amplifier 30 to substantially amplify weak signals. Operational amplifier 34 has one input capacitively coupled to the amplified input provided at the output of video amplifier 30, and has the other input coupled to the sytem variable threshold level $V_t$. The output of operational amplifier 34 is used to control the current path through differential amplifier 36. If amplified $e_1$ is greater than the threshold level ($V_t$) the current path is through A of differential amplifier 36. But, if amplified input $e_1$ is less than $V_t$, the current path will be through B of 36 and will provide a precision output through resistor $R_{11}$ to integrating filter 18. Filter 18 will effectively average the precision outputs through resistors $R_{11}$ and $R_{12}$ and will provide an output for adjusting $V_t$ when the level of input $e_1$ fails to exceed $V_t$ the selected portion of the time, or exceeds $V_t$ an excessive portion of the time. If $V_t$ is exceeded a portion of the time greater than that selected, $V_t$ is increased by high gain, low pass filter 18 for compensation. Similarly, if $V_t$ is exceeded a lesser portion of the time than that selected, $V_t$ is decreased by circuit 18.

Clamp 20 is coupled to $V_t$ and prevents it from decreasing to a level which would destroy proper operation of the system. When $V_t$ decreases to a value below 20mv, for example, an output is provided by clamp 20 through filter 18 to drive $V_t$ to a higher level. Output amplifier 22 receives inputs from system input $e_1$ and system variable threshold level $V_t$, and provides output $e_9$.

The embodiment shown in FIG. 2 may include the following components which will provide an operational circuit:

| SYMBOL | COMPONENT | TYPE OR VALUE |
| --- | --- | --- |
| $R_1$ | Resistor | 2.7 ohm |
| $R_2$ | Resistor | 47 ohm |
| $R_3$ | Resistor | 10 ohm |
| $R_4$ | Resistor | 2K ohm |
| $R_5$ | Resistor | 1K ohm |
| $R_6$ | Resistor | 100 ohm |
| $R_7$ | Resistor | 1K ohm |
| $R_8$ | Resistor | 270 ohm |
| $R_9$ | Resistor | 100 ohm |
| $R_{10}$ | Resistor | 33 ohm |
| $R_{11}, R_{12}$ | Resistor | 10K ohm |
| $R_{13}$ | Resistor | 1M ohm |
| $R_{14}$ | Resistor | 5.1K ohm |
| $R_{15}$ | Resistor | 20 ohm |
| $C_1$ | Capacitor | 6.8 micro farad |
| $C_2$ | Capacitor | 0.1 micro farad |
| $C_3, C_4$ | Capacitor | 0.1 micro farad |
| $C_5, C_6$ | Capacitor | 1 micro farad |
| $C_7$ | Capacitor | 0.1 micro farad |
| 30 | Op amp | $\mu$A733 |
| 32, 34 | Op Amp | MC1650 |
| 36 | Transistor | (2) 2N3160 |
| 38, 40 | Op Amp | (1)$\mu$A747 |
| $V_1$ | voltage supply | 5 volt |
| $V_2$ | voltage supply | 6 volt |

The circuit shown in FIG. 2 with the above components will establish a threshold voltage $V_t$ that is a function of input noise. $V_t$ relative to the rms noise voltage is established by the gain of op-amp 30 and the relative values of $R_9$ and $R_{10}$. Minimum threshold voltage is established by $R_{14}$ and $R_{15}$. By making $R_{10}$ 1/3 the value of $R_9$ the maximum current through B of differential amplifier 36 will be 1/3 the maximum current through A. Therefore, the precision output through $R_{11}$ will have to be provided three times as long as the precision output through $R_{12}$ if there is to be equality at the inputs of operational amplifier 40 of integrating filter 18. By selecting $R_9$ and $R_{10}$ to provide a different relative resistance, the placement of $V_t$ relative to the rms of $e_1$ can be selected as described above.

To those skilled in the art it will be obvious upon a study of this disclosure that the present invention permits a variety of modifications in structure and arrangement and hence can be given embodiments other than particularly illustrated and described herein without departing from the essential features of the invention within the scope of the claims annexed hereto.

What is claimed is:

1. An electronic circuit having a floating threshold value maintained a preselected number of decibels above the rms frequency weighted noise level in its input, comprising:

receiving and comparing means for receiving an electrical signal input and comparing it with the threshold value of said circuit;

means for providing at least one electrical output descriptive of the percentage of time said input exceeds said threshold;

threshold adjusting means for adjusting the value of said threshold to a level that is exceeded by said input a predetermined percentage of time regardless of the frequency of the input;

said receiving and comparing means being an electronic comparator having one input coupled to said input to said electronic circuit and another input coupled to the output of said threshold adjusting means;

said threshold adjusting means further including first and second electrical value output providing means providing a first electrical value output when said input exceeds said threshold and a second electrical value output when said input is less than said threshold, for weighting its output as a function of time;

wherein said first and second electrical value output providing means is an electronic limiter coupled to the output of said electronic comparator;

whereby the threshold is automatically adjusted to the level that is a preselected number of decibels above the rms frequency weighted noise level in said input, and wherein said predetermined percentage of time corresponds to said preselected number of decibels.

2. The circuit of claim 1 wherein said threshold adjusting means further includes a differential amplifier having first and second transistors wherein their bases are coupled to said comparator and said transistors provide mutually exclusive current paths in response to the output of said comparator, wherein one is rendered conductive and provides said first electrical value output when said input exceeds the threshold and the other is rendered conductive and provides said second electrical value output when said input fails to exceed the threshold.

3. The circuit of claim 2 wherein said circuit further includes means sensing said threshold value for preventing said threshold value from decreasing to a level below a preselected value.

4. The circuit of claim 3 wherein said measuring means further includes an electronic Fourier filter having transfer function $1/s+\tau$ coupled to said differential amplifier.

* * * * *